(12) United States Patent
Suto

(10) Patent No.: US 6,717,476 B2
(45) Date of Patent: Apr. 6, 2004

(54) MODULATOR

(75) Inventor: Kazuo Suto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 11 days.

(21) Appl. No.: 10/053,897

(22) Filed: Jan. 24, 2002

(65) Prior Publication Data

US 2003/0052744 A1 Mar. 20, 2003

(30) Foreign Application Priority Data

Sep. 19, 2001 (JP) .................................. 2001-284537

(51) Int. Cl.[7] .............................................. H03L 7/00
(52) U.S. Cl. ................... 331/23; 331/177 V; 332/127
(58) Field of Search ................. 332/127, 128; 331/10, 23, 177 V; 375/303, 306

(56) References Cited

U.S. PATENT DOCUMENTS

| 4,510,465 A | * | 4/1985 | Rice et al. ................. 332/16 T |
| 4,994,768 A | * | 2/1991 | Shepherd et al. ........... 332/127 |
| 6,476,684 B2 | * | 11/2002 | Park .......................... 332/127 |

FOREIGN PATENT DOCUMENTS

| JP | 2 (1990)-36215 | 3/1990 | ................. 331/23 |
| JP | 3 (1991)-54426 | 12/1991 | ................. 331/23 |
| JP | 6 (1994)-6597 | 2/1994 | ................. 331/23 |
| JP | 06-276022 | 9/1994 | ................. 331/23 |
| JP | 62 (1987)-2813 | 1/1997 | ................. 331/23 |
| JP | 11-068719 | 3/1999 | ................. 331/23 |

* cited by examiner

Primary Examiner—Henry Choe
(74) Attorney, Agent, or Firm—Volentine Francos, PLLC

(57) ABSTRACT

A modulator according to the invention includes: a PLL circuit that detects a phase difference between an input signal and a reference signal, an AGC circuit that controls a gain of a modulating signal and outputs a control signal, and a voltage controlled oscillation circuit that controls an oscillation frequency of a signal outputted from the PLL circuit on the basis of the control signal. Here, the voltage controlled oscillation circuit includes: a first voltage controlled reactance unit that inputs the signal outputted from the PLL circuit, a second voltage controlled reactance unit that inputs the control signal, and a high-frequency oscillation circuit connected in parallel with the first and second voltage controlled reactance units, which outputs the input signal. Thereby, the invention achieves to provide a modulator capable of compensating the deviation of the modulation factor, even when the frequency of the carrier signal varies.

14 Claims, 7 Drawing Sheets

FIG. 3(A) GAIN VS. CONTROL VOLTAGE CHARACTERISTIC IN THE AGC CIRCUIT

FIG. 3(B) OUTPUT FREQUENCY VS. CONTROL VOLTAGE CHARACTERISTIC IN THE VCO CIRCUIT

FIG. 3(C) RELATION BETWEEN THE GAIN OF THE AGC CIRCUIT AND THE OUTPUT FREQUENCY OF THE VCO CIRCUIT

MODULATOR

BACKGROUND OF THE INVENTION

1. Field of the Invention

The present invention relates to a modulator, specifically to a modulator for use in radio equipment.

This application is a counterpart of Japanese patent application, Serial Number 284537/2001, filed Sep. 19, 2001, the subject matter of which is incorporated herein by reference.

2. Description of the Related Art

Figure 7:
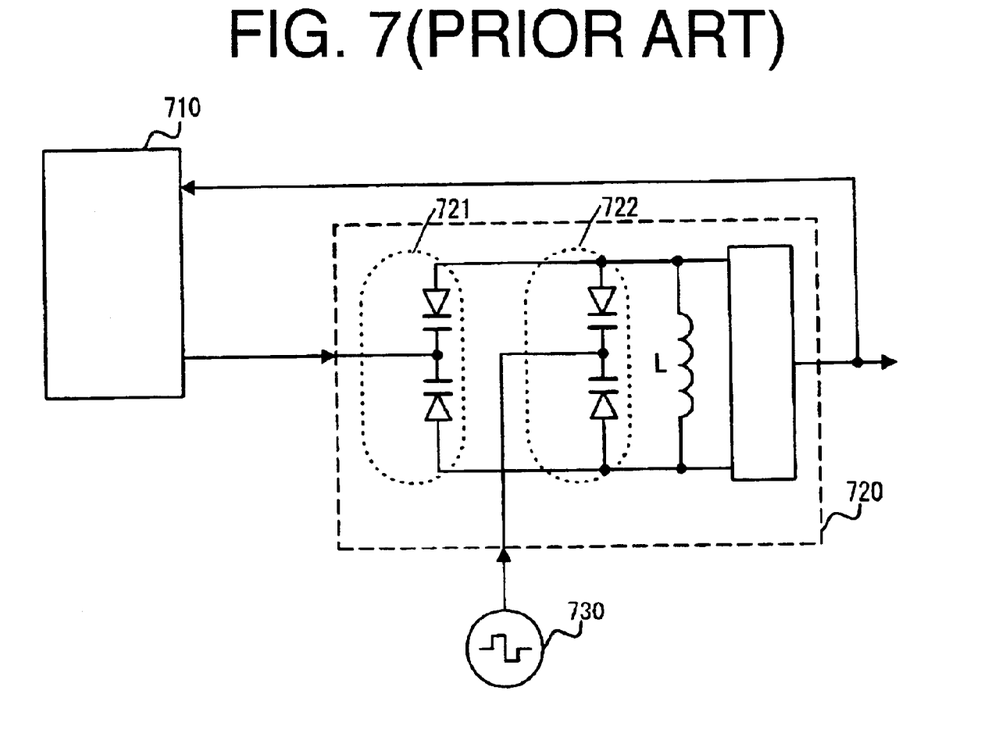
FIG. 7 is a block diagram illustrating a conventional modulator.

Conventionally, a modulator by the so-called direct modulation system has a configuration illustrated in FIG. 7. Here, the direct modulation system directly applies a modulating signal, such as a data pulse train, etc., to voltage controlled reactance elements inside a resonance circuit included in a Voltage Controlled Oscillator 720 (hereunder, simply referred to as "VCO") being a constituent of the modulator.

In such a modulator as shown in FIG. 7, the resonance circuit included in the VCO 720 possesses two pairs of the voltage controlled reactance elements such as varactor diodes, or the like. And, to one of them, to the varactor diode 721 is applied the control voltage outputted from a Phase-Locked Loop (hereunder, simply referred to as "PLL") circuit 710 for setting a carrier frequency, as the dc bias voltage; and to the other varactor diode 722 is applied a modulating signal 730 as the dc bias voltage.

Generally, the modulation factor in the modulator as shown in FIG. 7 is defined by the following expression.

Modulation Factor=Frequency Deviation/(Modulating signal Data Rate/2)  (1)

Here, the denominator of the expression (1) represents the frequency of the modulating signal. On the other hand, the numerator of the expression (1), the frequency deviation is given by the following.

$\Delta C2/(C1+C2)$  (2)

In the expression (2), C1 and C2 signify the capacitance values in each of the series branches of the varactor diodes VD1 and VD2, and $\Delta C2$ represents the capacitance variation of the capacitance C2.

Now, assuming that the setting of the carrier frequency is made changed in the modulator in FIG. 7, it is natural that the capacitance C1 of the varactor diode 721 for setting the carrier frequency varies to follow the control voltage outputted from the PLL 710. In contrast to this, the capacitance C2 of the varactor diode 722 for the direct modulation is almost constant, being proportional to the mark rate of the transmission data as the modulating signal. For example, when the carrier frequency is raised, the control voltage from the PLL 710 is also increased, which decreases the capacitance C1 of the varactor diode 721. The reason is as follows. The varactor diode controls the thickness of the depletion layer produced on the PN junction by the dc bias voltage applied, and thereby achieves the variable reactance characteristic. Therefore, if the dc bias voltage is increased, the reverse field on the PN junction is strengthened to widen the depletion layer, whereby the capacitance C1 formed by the depletion layer is to be decreased. On the other hand, the capacitance C2 of the varactor diode 722, as mentioned above, is in irrelevance with the carrier signal; accordingly, the capacitance C2 remains constant even with the variation of the carrier frequency.

In other words, varying the frequency of the carrier signal varies the value of C1 in the expression (2), which gives an influence to the value of the frequency deviation, and the variation of the frequency deviation leads to a variation of the modulation factor given by the expression (1). In general, the modulation factor in the modulator represents the depth of modulation of the modulating signal against the carrier signal. Therefore, if the modulation factor varies, the distribution of the frequency band and frequency spectrum in possession of the carrier signal having the modulation applied, which is the output signal of the modulator, will vary, thus leading to apprehensions that the demodulation on the receiver side cannot be made smoothly.

SUMMARY OF THE INVENTION

An object of the present invention is to provide a modulator capable of compensating the deviation of the modulation factor, even when the frequency of the carrier signal varies.

According to one aspect of the present invention, for achieving the above object, there is provided a modulator having an AGC circuit that controls a gain of a modulating signal and outputs a control signal, having a PLL circuit that produces a phase difference between an input signal and a reference signal, and having a voltage controlled oscillation circuit that controls an oscillation frequency of a signal outputted from the PLL circuit on the basis of the control signal, wherein the voltage controlled oscillation circuit includes: a first voltage controlled reactance unit that inputs the signal outputted from the PLL circuit, a second voltage controlled reactance unit that inputs the control signal, and a high-frequency oscillation circuit connected in parallel with the first and second voltage controlled reactance units, which outputs the input signal.

The above and further objects and novel features of the invention will more fully appear from the following detailed description, appended claims and the accompanying drawings.

DETAILED DESCRIPTION OF THE PREFERRED EMBODIMENTS

Figure 1:
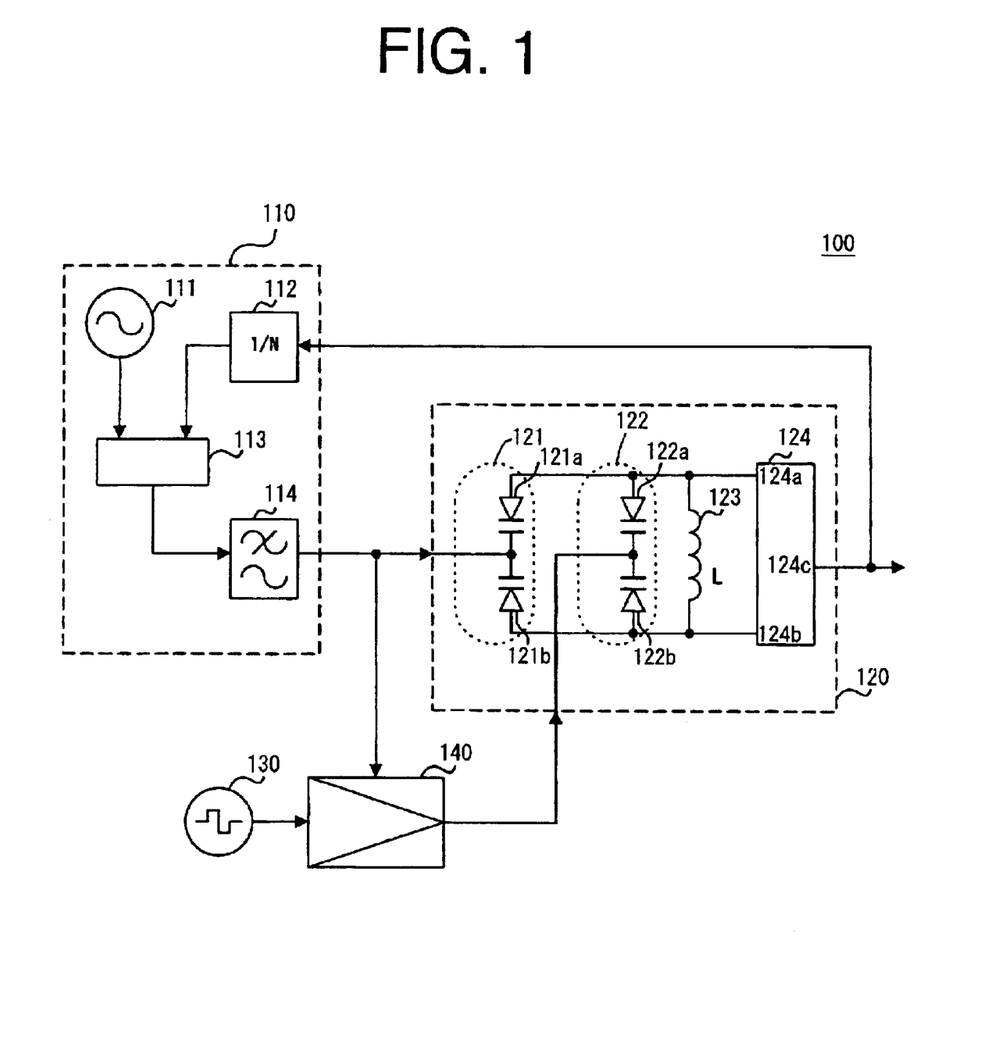
FIG. 1 is a block diagram illustrating a modulator of the first embodiment of the invention.

FIG. 1 is a block diagram of the modulator relating to the first embodiment. The construction of the modulator 100 will now be discussed with reference to FIG. 1.

First, the modulator 100 based on this embodiment is configured with a PLL circuit 110, a VCO circuit 120, a modulating signal source 130, and an automatic gain control (hereunder, simply referred to as "AGC") circuit 140. Here, since the modulating signal (transmission signal) in this modulator is a digital data of, for example, data pulse trains, and is supplied from a data terminal outside this modulator, the explanation of the modulating signal 130 will be omitted.

The PLL circuit 110 determines the frequency of a carrier signal in the modulator. A reference frequency oscillator 111, a frequency divider 112, a phase/frequency comparator (hereunder, simply referred to as "comparator") 113, and a loop filter 114 constitute the PLL circuit 110. The reference frequency oscillator 111 is a high-precision and high-stability oscillator that employs a resonator, such as a crystal element or a ceramic element, as the oscillation source, which generates a reference frequency signal to be used as the reference of the carrier signal frequency. The frequency divider 112 is a frequency divider that lowers a frequency of a modulated output signal from the VCO 120 described later to the same frequency as the reference frequency, which is made up, for example, with a down-counter circuit or a cascaded connection circuit of flip-flops. With regard to the frequency dividing ratio 1/N in the frequency divider 112, it is assumed that a user is able to arbitrarily set the ratio 1/N from the outside of the modulator in accordance with a desired carrier signal frequency. The comparator 113 is a circuit that compares the frequencies and phases of the reference frequency signal from the reference frequency oscillator 111 and the output signal from the frequency divider 112. The loop filter 114 is a low-pass filter that possesses a transmission frequency characteristic, such as the Butter Worth characteristic or the Chebychev characteristic, or the like, which cuts off the high-frequency components from the output signal of the comparator 113.

The VCO circuit 120 is made up with a first varactor diode unit 121, a second varactor diode unit 122, and a resonance circuit 123, and a high frequency oscillator 124. The first varactor diode unit 121, second varactor diode unit 122, and resonance circuit 123, and high frequency oscillator 124 are connected in parallel with each other.

The high frequency oscillator 124 is composed of, for example, a Hartley-type, Colpitts-type, or multivibrator-type oscillation circuit. The high frequency oscillator 124 oscillates the signal of the carrier signal frequency band in cooperation with the resonance circuit 123. The oscillation frequency of the VCO circuit 120 is determined by the capacitances of varactor diodes 121*a*, 121*b*, the capacitances of varactor diodes 122*a*, 122*b*, and an inductance L of the resonance circuit 123. The high frequency oscillator 124 has two input terminals 124*a*, 124*b*, and one output terminal 124*c*.

The first varactor diode unit 121 is composed of the varactor diodes 121*a*, 121*b* being the voltage controlled reactance elements. The varactor diode has two terminals of the cathode and the anode. The cathodes of varactor diodes 121*a* and 121*b* are connected each other, and at the node where the two Cathodes are connected is inputted the output voltage from the PLL circuit 110. The anode of the varactor diode 121*a* is connected to the input terminal 124*a* of the high frequency oscillator 124, and the anode of the varactor diode 121*b* is connected to the input terminal 124*b* of the high frequency oscillator 124. In the same manner, the second varactor diode unit 122 is composed of the varactor diodes 122*a*, 122*b*. The cathodes of varactor diodes 122*a* and 122*b* are connected each other, and where the two cathodes are connected is inputted the output signal from the AGC circuit 140. The anode of the varactor diode 122*a* is connected to the input terminal 124*a* of the high frequency oscillator 124, and the anode of the varactor diode 122*b* is connected to the input terminal 124*b* of the high frequency oscillator 124.

The resonance circuit 123 is composed of the inductance element. The inductance element has two terminals. One end of the inductance element is connected to the input terminal 124*a* of the high frequency oscillator 124, and the other terminal is connected to the input terminal 124*b* of the high frequency oscillator 124.

Figure 2:
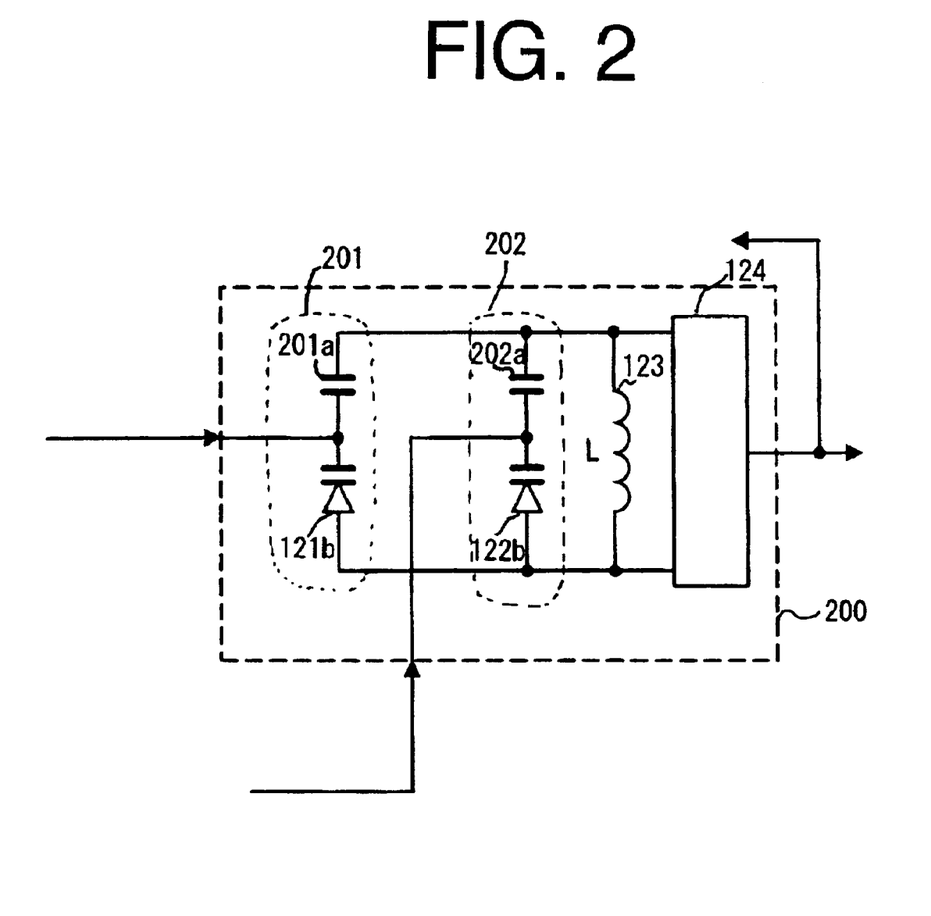
FIG. 2 is a block diagram illustrating a modified example of a VCO circuit relating to the modulator of the first embodiment of the invention.

Further, the configuration of the varactor diode unit in the VCO circuit 120 may be made as in FIG. 2. The VCO circuit 200 is made up with a varactor diode unit 201, a varactor diode unit 202, and the resonance circuit 123, and the high frequency oscillator 124. The varactor diode unit 201, varactor diode unit 202, and resonance circuit 123, and high frequency oscillator 124 are connected in parallel with each other. The varactor diode unit 201 is composed of a static capacitance element (capacitor) 201*a* for cutting off the dc bias voltage, and the varactor diode 121*b*. One end of the capacitor 201*a* is connected to the input terminal 124*a* of the high frequency oscillator 124. The other end of the capacitor 201*a* is connected to the cathode of the varactor diode 121*b*, where is inputted the output voltage from the PLL circuit 110. The anode of the varactor diode 121*b* is connected to the input terminal 124*b* of the high frequency oscillator 124. In the same manner, the varactor diode unit 202 is composed of a static capacitance element (capacitor) 202*a* for cutting off the dc bias voltage, and the varactor diode 122*b*. One end of the capacitor 202*a* is connected to the input terminal 124*a* of the high frequency oscillator 124. The other end of the capacitor 202*a* is connected to the cathode of the varactor diode 122*b*, where is inputted the output signal from the AGC circuit 140. And, the anode of the varactor diode 122*b* is connected to the input terminal 124*b* of the high frequency oscillator 124.

The AGC circuit 140 is a variable gain amplifier, and to the gain control terminal thereof is applied the control voltage from the loop filter 114 of the PLL circuit 110. And, after being amplified by the AGC circuit 140, the modulating signal (transmission signal) from the modulating signal source 130 is applied to the varactor diode unit 122 inside the VCO circuit 120 as the dc bias voltage.

The operation of the modulator in this embodiment will now be explained.

The carrier signal with the modulation applied, being the output of the VCO circuit 120, is outputted from the modulator as shown in FIG. 1 to a preamplifier (not illustrated) of a transmission power amplifier, for example, and part of the carrier signal is branched to enter at the frequency divider 112 inside the PLL circuit 110. Inside the PLL circuit 110, the carrier frequency signal having the frequency divided by the frequency divider 112 and the reference frequency signal are supplied to the comparator 113, where the frequencies of both the signals and the phases of both are compared. When the frequencies of both and the phases of both are coincident, the comparator 113 locks the output to a specific value. When there are discrepancies between the frequencies of both and between the phases of both, the comparator 113 intends to increase or decrease the output value in a direction as to correct such discrepancies. The output from the comparator 113 is supplied to the loop filter 114, where the alternating components are removed; and the dc components are supplied to the varactor diode unit 121 of the VCO circuit 120, as the do control voltage.

In the modulator as shown in FIG. 1, the frequency of the carrier signal is maintained at a specific set value by such a function of the feedback loop. When the carrier signal frequency is set changed, it is only needed to change the dividing ratio to be set into the frequency divider 112 to a desired value, as mentioned above.

Figure 3A:
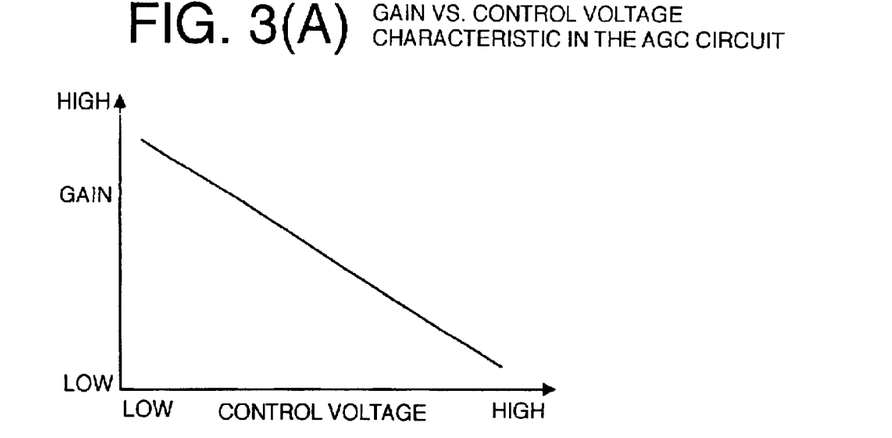
FIG. 3 is a graph illustrating the gain of an AGC circuit and the frequency characteristic of the VCO circuit of the modulator relating to the first embodiment of the invention.
Figure 3B:
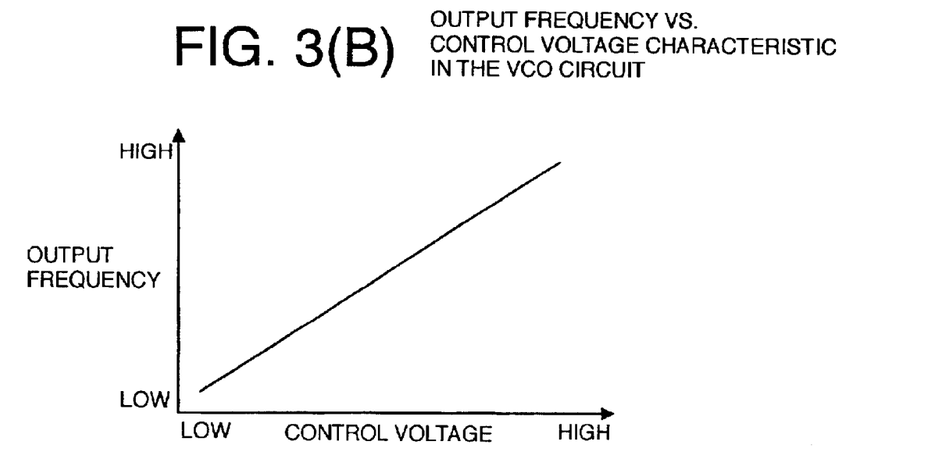
Figure 3C:
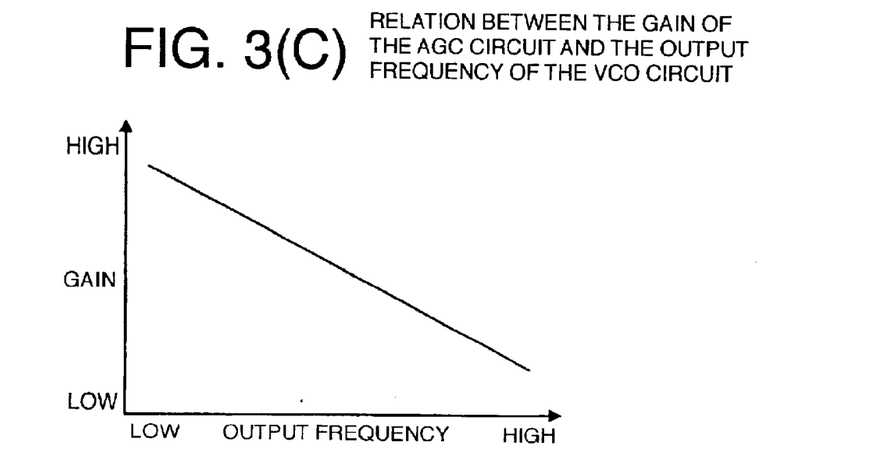

In this embodiment, the control voltage outputted from the PLL circuit 110 is supplied not only to the varactor diode unit 121 inside the VCO circuit 120 as the dc bias voltage, but also to the gain control terminal of the AGC circuit 140 at the same time. Now, the gain of the AGC circuit 140 shows the characteristic that varies according to the control voltage applied to the gain control terminal, as illustrated in FIG. 3(A). On the other hand, the PLL circuit 110 has the relation between the frequency of the carrier signal and the output control voltage thereof, as shown in FIG. 3(B). This relation results from, as mentioned above, that as the value of the dc bias voltage applied to the varactor diode unit 121 increases, the capacitance formed by the depletion layer on the PN junction of the varactor diode decreases, which raises the oscillation frequency of the VCO circuit 120, that is, the frequency of the carrier signal having the modulation applied. Therefore, the characteristics shown in FIG. 3(A) and FIG. 3(B) induces the relation between the gain of the AGC circuit 140 and the carrier signal frequency outputted from the VCO circuit 120, as illustrated in FIG. 3(C).

That is, as the carrier signal frequency heightens, the gain of the AGC circuit 140 lowers, which relatively decreases the amplitude of the modulating signal outputted from the AGC circuit 140. The output from the AGC circuit 140 is served as the dc bias voltage to the varactor diode unit 122 of the VCO circuit 120, and the bias voltage decreases accordingly. Thus, the variation of the bias voltage varies the capacitance C2 of the varactor diode unit 122 and the capacitance variation ΔC2 thereof.

In other words, according to the configuration of the modulator in this embodiment, when the capacitance C1 of the varactor diode unit 121 varies, the capacitance C2 and the capacitance variation ΔC2 of the varactor diode unit 122 also vary, to follow the variation of the former. Therefore, an appropriate setting of the relation between these constants makes it possible to maintain the value of the expression (2) (ΔC2/(C1+C2)) always at a constant level. Thus, even if the frequency setting of the carrier signal of the modulator is varied, the value of the frequency deviation in the aforementioned expression (1) will become constant, which makes it possible to hold the modulation factor constant in the modulator.

Figure 4:
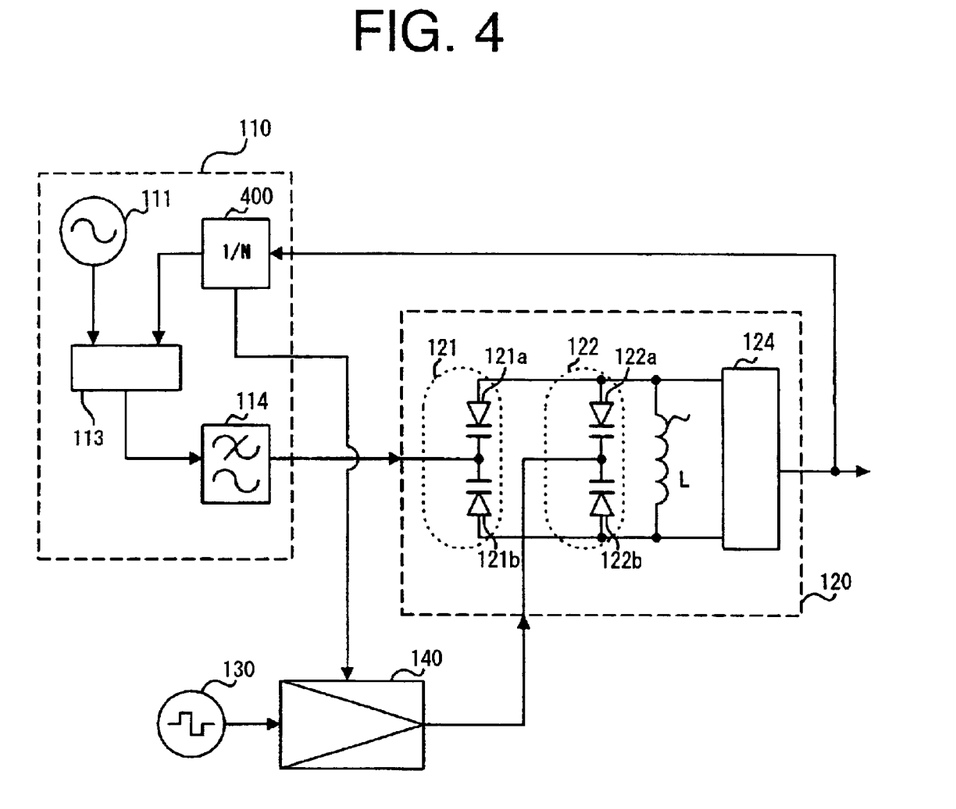
FIG. 4 is a block diagram illustrating a modified example of a modulator relating to the first embodiment of the invention.

The construction of the modulator in this embodiment is not limited to the one illustrated in FIG. 1. As shown in FIG. 4, for example, the gain of the AGC circuit 140 may be made to vary according to the frequency dividing ratio 1/N that is set by the frequency divider 400 inside the PLL circuit 110. In brief, when the carrier signal frequency is high, the frequency dividing ratio required for lowering it to the reference frequency of the reference frequency oscillator 111 becomes large, as compared to the case when the carrier signal frequency is low. Therefore, a construction may be made which utilizes the difference of the frequency dividing ratio depending on the carrier signal frequency being high or low, converts the value of the frequency dividing ratio set by the frequency divider 400 into an appropriate analog voltage by means of the digital-to-analog conversion, applies this analog voltage to the gain control terminal of the AGC circuit 140, and thereby varies the gain automatically. Thereby, the amplitude of the modulating signal applied as the dc bias voltage of the varactor diode unit 122 is controlled by the carrier signal frequency being high or low, thus exhibiting the same effect as the embodiment shown in FIG. 1.

Next, the second embodiment according to the invention will be explained on the basis of the block diagram illustrated in FIG. 5. The components in the second embodiment that are the same as those in the first embodiment are given the same numerical symbols to avoid the redundancy of the description The modulator of the second embodiment is configured with the PLL circuit 110, the modulating signal source 130, a selection switching circuit 500, and a VCO circuit 510.

The selection switching circuit 500 has an input terminal 500a, a switching control terminal 500b and two output terminals 500c, 500d. Further, including two switch circuits SW1, SW2, the selection switching circuit 500 turns the two switch circuits SW1, SW2 into the ON state, in accordance with the voltage level applied to the switching control terminal 500b.

The VCO circuit 510 is made up with the first varactor diode unit 121, a second varactor diode unit 511, a third varactor diode unit 512, the resonance circuit 123, and the high frequency oscillator 124. In the VCO circuit 510, the first varactor diode unit 121, second varactor diode unit 511, third varactor diode unit 512, resonance circuit 123, and high frequency oscillator 124 are connected in parallel each other. The second varactor diode unit 511 is configured with varactor diodes 511a, 511b. The cathodes of the varactor diodes 511a, 511b are connected each other, and at the node where these are connected is inputted an output voltage from the output terminal 500c of the selection switching circuit 500. The anode of the varactor diode 511a is connected to the input terminal 124a of the high frequency oscillator 124, and the anode of the varactor diode 511b is connected to the input terminal 124b of the high frequency oscillator 124. In the same manner, the third varactor diode unit 512 is composed of the varactor diodes 512a, 512b. The cathodes of the varactor diodes 512a and 512b are connected each other, and where the two cathodes are connected is inputted an output voltage from the output terminal 500d of the selection switching circuit 500. The anode of the varactor diode 512a is connected to the input terminal 124a of the high frequency oscillator 124, and the anode of the varactor diode 512b is connected to the input terminal 124b of the high frequency oscillator 124.

Next, the operation of the modulator in the second embodiment will be explained. However, the explanations of the operation common to the first embodiment will be omitted.

In this embodiment, the control voltage outputted from the PLL circuit 110 is supplied not only to the varactor diode unit 121 inside the VCO circuit 510 as the dc bias voltage, but also to the switch control terminal of the selection switching circuit 500 at the same time. Now, the selection switching circuit 500 determines the operation of the switch circuits contained therein, in accordance with the magnitude of the control voltage. For example, when the control voltage is high, the selection switching circuit 500 turns the switch (SW1) only into ON; and when the control voltage is low, it turns the switch (SW1) and the switch (SW2) both into ON. The switching of these changes the capacitance of the varactor diode for the direct modulation into the capacitance of the varactor diode unit 511 only, or the capacitance of the varactor diode unit 511 and the varactor diode unit 512 that are connected in parallel. Therefore, if the change of a set carrier frequency varies the capacitance C1 of the varactor diode unit 121 for determining the carrier frequency, the capacitance of the varactor diode for the direct modulation also varies to follow the variation, which accordingly suppresses the width of variation given by the foregoing expression (2) that influences the frequency deviation. As the result, it becomes possible to suppress the variation of the modulation factor, accompanied with the setting change of the carrier signal frequency in the modulator.

Figure 5:
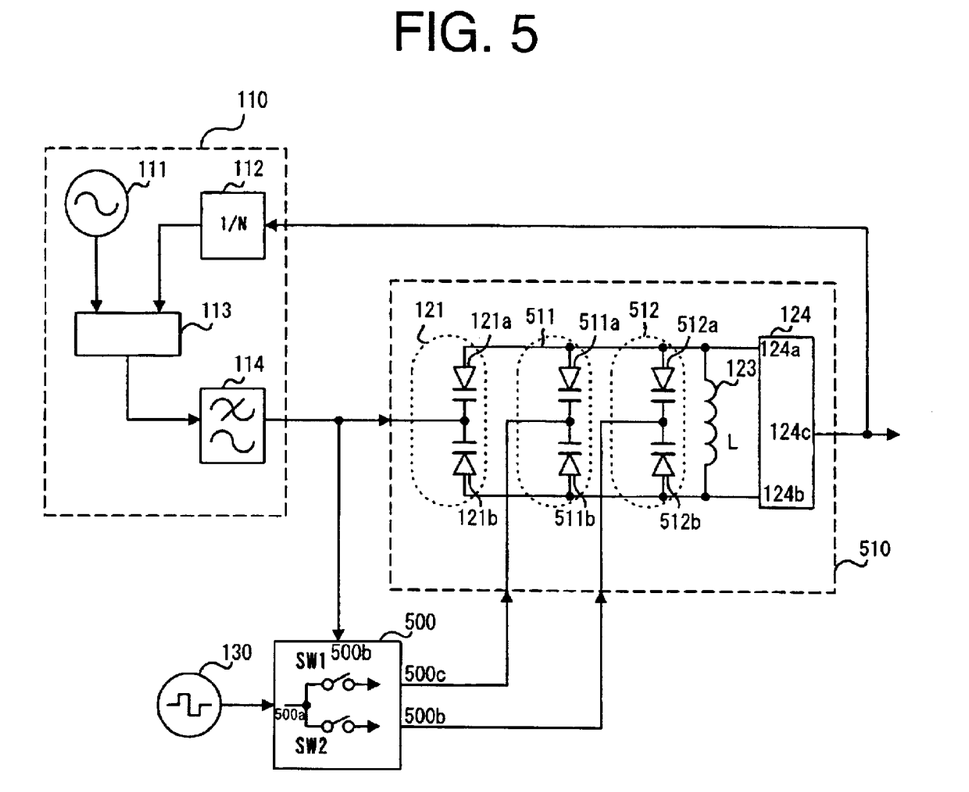
FIG. 5 is a block diagram illustrating a modulator of the second embodiment of the invention.
Figure 6:
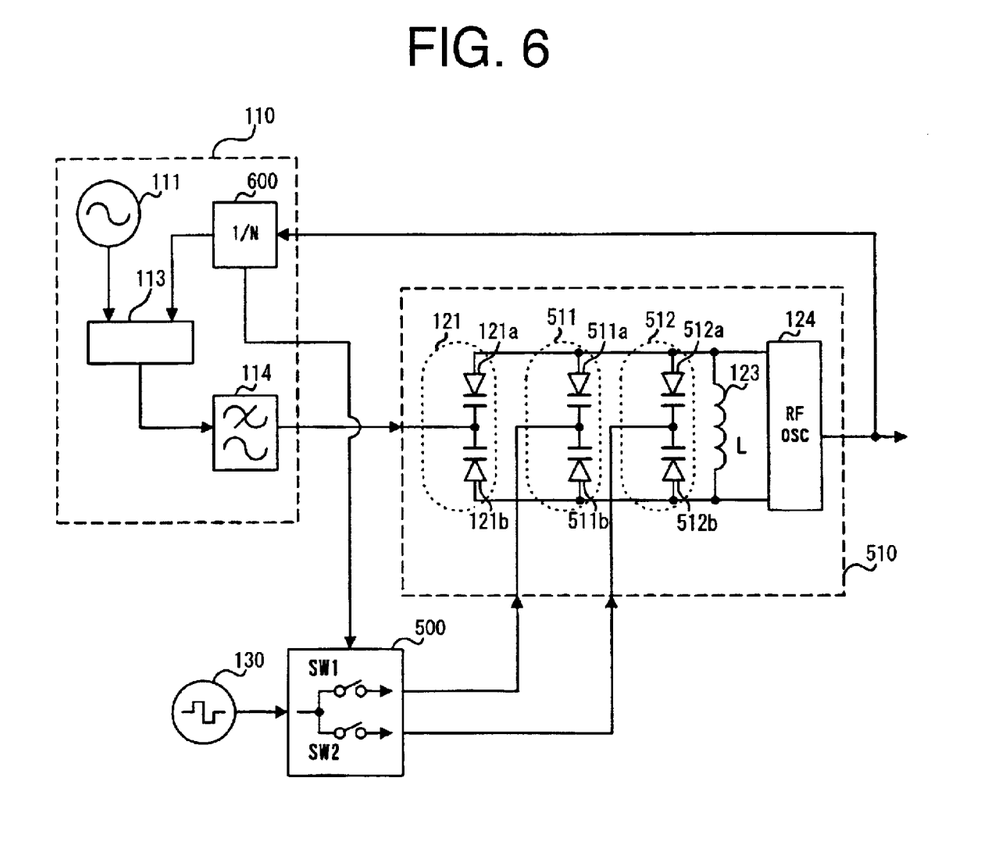
FIG. 6 is a block diagram illustrating a modified example of the modulator relating to the second embodiment of the invention.

The construction of the modulator in this embodiment is not limited to the one illustrated in FIG. 5. As shown in FIG. 6, for example, the switching of the switches inside the selection switching circuit 500 may be controlled according to the frequency dividing ratio 1/N that is set by the frequency divider 600 inside the PLL circuit 110. In brief, when the carrier signal frequency is high, the frequency dividing ratio required for lowering it to the reference frequency of the reference frequency oscillator 111 becomes large, as compared to the case when the carrier signal frequency is low. Therefore, a construction may be made which converts the value of the frequency dividing ratio thus set into an appropriate analog voltage by means of, for example, the digital-to-analog conversion, applies this analog voltage to the switch control terminal of the selection switching circuit 500, and thereby controls the switching of the switches. Thereby, the capacitance of the varactor diode connected in parallel, being served for the direct modulation, can be made variable, which achieves the same effect as the embodiment shown in FIG. 5.

Further, the number of the varactor diodes used in the second embodiment is not limited to those in FIG. 5 and FIG. 6. It may be arranged to increase the series branches of the varactor diodes in the resonance circuit inside the VCO circuit 510, and the switch circuits inside the selection switching circuit 500 to more than two, and to execute a further detailed compensation to the deviation of the modulation factor that is affected with the variation of the carrier frequency.

According to this embodiment, the capacitance of the varactor diode for the direct modulation can be attained by arbitrarily connecting the divided varactor diodes with the switches, whereby the modulation factor when the carrier frequency is varied can easily be suppressed within a certain range.

Being discussed in detail, the invention will provide the modulator using the direct modulation system that compensates the deviation of the modulation factor when the setting of the carrier frequency varies, and maintains it at a constant value.

What is claimed is:

1. A modulator comprising:
    a PLL circuit which detects a phase difference between an input signal and a reference signal, wherein the PLL circuit outputs a signal of which an undesired frequency component is removed;
    an AGC circuit which controls a gain of a modulating signal based on the signal outwitted from the PLL circuit and outputs a control signal; and
    a voltage controlled oscillation circuit which controls an oscillation frequency of a signal outputted from said PLL circuit based on said control signal, wherein said voltage controlled oscillation circuit includes;
        a first voltage controlled reactance unit which inputs said signal output outputted from said PLL circuit; and
        a second voltage controlled reactance unit which inputs said control signal; and
        a high-frequency oscillation circuit connected in parallel with said first and second voltage controlled reactance units, which outputs said input signal.

2. The modulator as claimed in claim 1, wherein the first voltage controlled reactance unit includes a first varactor diode and a second varactor diode, wherein the cathodes of the first varactor diode and second varactor diode are connected to each other, and the signal outputted from the PLL circuit is inputted where the cathodes are connected to each other.

3. The modulator as claimed in claim 2, wherein the second voltage controlled reactance unit includes a third varactor diode and a fourth varactor diode, wherein the cathodes of the third varactor diode and fourth varactor diode are connected to each other, and the control signal is inputted where the cathodes are connected to each other.

4. The modulator as claimed in claim 1, wherein the PLL circuit comprises:
    an oscillator that generates the reference signal;
    a frequency divider that divides the frequency of the input signal;
    a comparator which compares the reference signal and the divided input signal to detect a phase difference.

5. The modulator as claimed in claim 1, wherein the first voltage controlled reactance unit includes a first varactor diode and a first capacitor, wherein the cathode of the first varactor diode is connected to one end of the first capacitor, and the signal outputted from the PLL circuit is inputted where the cathode and the one end are connected to each other.

6. The modulator as claimed in claim 5, wherein the second voltage controlled reactance unit includes a second varactor diode and a second capacitor, wherein the cathode of the second varactor diode is connected to one end of the second capacitor, and the control signal is inputted where the cathode and the one end are connected to each other.

7. A modulator comprising:
    a PLL circuit that detects a phase difference between an input signal and a reference signal,
    a selection circuit that outputs control signals on the basis of a signal outputted from the PLL circuit, and
    a voltage controlled oscillation circuit that controls an oscillation frequency of the signal outputted from the PLL circuit on the basis of the control signal,
    wherein the voltage controlled oscillation circuit includes:
        a first voltage controlled reactance unit that inputs the signal outputted from the PLL circuit,
        second and third voltage controlled reactance units that input the control signals, and
        a high-frequency oscillation circuit connected in parallel with the first, second, and third voltage controlled reactance units, which outputs the input signal.

8. The modulator as claimed in claim 7, wherein:
    the first voltage controlled reactance unit includes a first varactor diode and a second varactor diode, in which the cathodes of the first varactor diode and second varactor diode are connected to each other, and the signal outputted from the PLL circuit is inputted where the cathodes are connected to each other;
    the second voltage controlled reactance unit includes a third varactor diode and a fourth varactor diode, in which the cathodes of the third varactor diode and fourth varactor diode are connected to each other, and the control signal is inputted where the cathodes are connected to each other; and the third voltage controlled reactance unit includes a fifth varactor diode and a sixth varactor diode, in which the cathodes of the fifth varactor diode and sixth varactor diode are connected to each other, and the control signal is inputted where the cathodes are connected to each other.

9. The modulator as claimed in claim 8, wherein the PLL circuit includes an oscillator that generates the reference signal, a frequency divider that divides the frequency of the input signal to output a frequency divided signal, and a comparator that compares the reference signal and the frequency divided signal to detect a phase difference between both.

10. The modulator as claimed in claim 8, wherein the selection circuit outputs the control signal to the second voltage controlled reactance unit, when a voltage level of the signal outputted from the PLL circuit is higher than a threshold level, and outputs the control signal to the second and third voltage controlled reactance units, when the voltage level of the signal outputted from the PLL circuit is lower than the threshold level.

11. A modulator comprising:
   a PLL circuit that compares phases of a reference signal and a frequency divided signal in which a frequency of an input signal is divided, and outputs a phase difference signal,
   a selection circuit that outputs control signals on the basis of the frequency divided signal, and
   a voltage controlled oscillation circuit that controls an oscillation frequency of the phase difference signal on the basis of the control signal,
   wherein the voltage controlled oscillation circuit includes:
      a first voltage controlled reactance unit that inputs the phase difference signal,
      second and third voltage controlled reactance units that input the control signals, and
      a high-frequency oscillation circuit connected in parallel with the first, second, and third voltage controlled reactance units, which outputs the input signal.

12. The modulator as claimed in claim 11 wherein:
   the first voltage controlled reactance unit includes a first varactor diode and a second varactor diode, in which the cathodes of the first varactor diode and second varactor diode are connected to each other, and the phase difference signal is inputted where the cathodes are connected to each other;
   the second voltage controlled reactance unit includes a third varactor diode and a fourth varactor diode, in which the cathodes of the third varactor diode and fourth varactor diode are connected to each other, and the control signal is inputted where the cathodes are connected to each other; and
   the third voltage controlled reactance unit includes a fifth varactor diode and a sixth varactor diode, in which the cathodes of the fifth varactor diode and sixth varactor diode are connected to each other, and the control signal is inputted where the cathodes are connected to each other.

13. The modulator as claimed in claim 12, wherein the PLL circuit includes an oscillator that generates the reference signal, a frequency divider that divides the frequency of the input signal to output the frequency divided signal, and a comparator that compares the reference signal and the frequency divided signal to detect a phase difference between both.

14. The modulator as claimed in claim 12, wherein the selection circuit outputs the control signal to the second voltage controlled reactance unit, when a voltage level of the phase difference signal is higher than a threshold level, and outputs the control signal to the second and third voltage controlled reactance units, when the voltage level of the phase difference signal is lower than the threshold level.

* * * * *